United States Patent [19]

Lurie et al.

[11] Patent Number: 4,891,593

[45] Date of Patent: Jan. 2, 1990

[54] METHODS OF OBTAINING IMAGES REPRESENTING THE DISTRIBUTION OF PARAMAGNETIC MOLECULES IN SOLUTION

[75] Inventors: John Lurie; David M. Bussell; John R. Mallard, all of Aberdeen, Scotland

[73] Assignee: National Research Development Corporation, London, England

[21] Appl. No.: 228,218

[22] Filed: Aug. 4, 1988

[30] Foreign Application Priority Data

Aug. 5, 1987 [GB] United Kingdom ................. 8718515

[51] Int. Cl.[4] ............................................ G01R 33/20
[52] U.S. Cl. ..................................... 324/307; 324/300
[58] Field of Search ............... 324/300, 307, 308, 309, 324/310, 312, 311, 313, 318, 322

[56] References Cited

U.S. PATENT DOCUMENTS

| | | | |
|---|---|---|---|
| 4,238,735 | 12/1980 | Muller | 324/310 |
| 4,345,207 | 8/1982 | Bertrand et al. | 324/308 |
| 4,443,761 | 4/1984 | Levitt | 324/311 |
| 4,502,008 | 2/1985 | Ohuchi | 324/311 |
| 4,521,732 | 6/1985 | Pegg et al. | 324/300 |
| 4,709,212 | 11/1987 | MacFall et al. | 324/300 |

OTHER PUBLICATIONS

Fujii, H. and Berliner, L. J. Magn. Reson. Med. 2, 275–282, (1985).
Eaton, S. S. and Eaton, G. R., J. Magn. Reson. 59, 474–477, (1985).
Berliner, L. J. and Fujii, H., Science 227, 517–519, (1985).
Maltempo, M. M., Eaton, S. S. and Eaton, G. R., J. Magn. Reson. 72, 449–455, (1987).
Dwek, R. A., Richards, R. E. and Taylor, D., Ann. Rev. NMR Spectr. 2, 293–344, (1969).
Muller-Warmuth, W. and Meise-Gresch, K., Adv. Magn. Reson. 11, 1–45, (1983).
J. Phys. E: Sci. Instrum., vol. 13, (1980), pp. 947–955.
J. Mag. Res. 63, pp. 622–628, (1985).

Primary Examiner—Muchael J. Tokar
Attorney, Agent, or Firm—Cushman, Darby & Cushman

[57] ABSTRACT

An image of the distribution of the molecules of a paramagnetic substance in solution obtained by exciting EPR resonance in the solute and obtaining an NMR image of selected nuclei (e.g. protons) in the solvent.

5 Claims, 1 Drawing Sheet

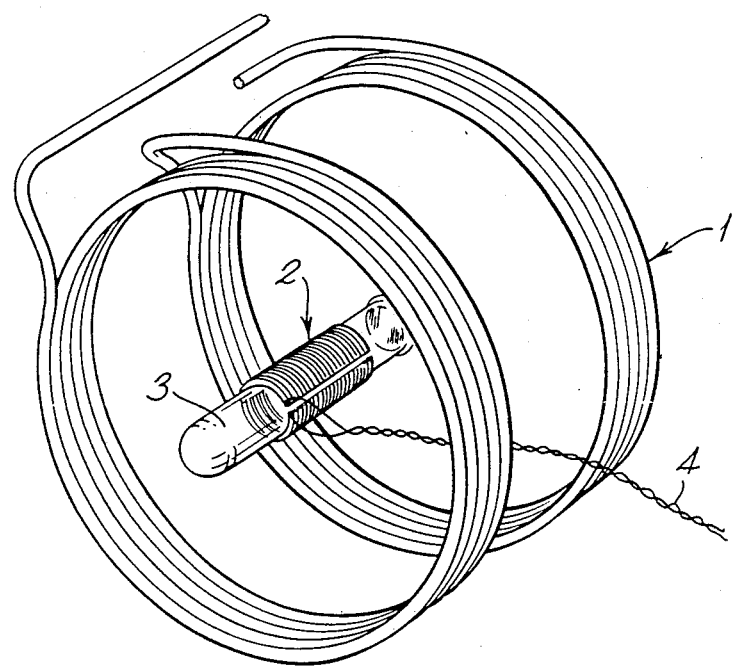

METHODS OF OBTAINING IMAGES REPRESENTING THE DISTRIBUTION OF PARAMAGNETIC MOLECULES IN SOLUTION

This invention relates to methods of obtaining images representing the distribution of paramagnetic molecules in solution, including free radicals. The invention has application inter alia in the determination of the distribution of free radicals, which may have been previously injected, in living tissue.

Electron paramagnetic resonance (EPR) imaging using methods analogous to those employed in nuclear magnetic resonance (NMR) imaging but at much higher nutation frequencies is known. However, in view of the strong magnetic field gradients necessary to achieve good spatial resolution, EPR imaging has so far been restricted to small samples.

Where a solution contains a paramagnetic solute it is also known to excite EPR resonance of the solute and observe the NMR resonance of nuclei in the solvent. Under favourable conditions saturation of the EPR resonance in the solute causes a dramatic enhancement of the NMR signal from the solvent. In particular, the effect requires that the NMR nuclei be relaxed by their interactions with the unpaired electrons of the solute.

It is an object of the invention to utilise the above phenomenon to obtain image information of paramagnetic free radicals in solution.

According to the invention a method of obtaining image information representing the distribution of paramagnetic molecules in solution comprises the steps of applying radio-frequency radiation to excite EPR resonance in the solute and obtaining an NMR image signal of selected nuclei of the solvent. the signal from those selected nuclei which interact with electrons excited by the rf radiation being enhanced.

In carrying out the invention there may also be included the additional steps of obtaining an NMR image signal of said selected nuclei which is unenhanced, and deriving image information representing the difference between the enhanced and unenhanced image signals.

The NMR image signal may be obtained by any conventional NMR imaging technique. In preferred embodiments the said selected nuclei are protons.

The maximum possible enhancement is given by $-v_S/2v_I$ where $v_S$ and $v_I$ are the EPR and NMR frequencies respectively; for protons, this corresponds to a factor of $-330$. (A negative enhancement means that the NMR signal changes phase by 180 degrees upon irradiation of the EPR resonance, while its magnitude increases by the numerical factor). The observed enhancement factor depends on the degree of saturation of the EPR resonance of the solute and therefore on the strength of the irradiating magnetic field. It also depends on the concentration of the paramagnetic compound, the particular solvent and solute under study, the temperature of the sample and the strength of the static magnetic field.

In order that the invention may be more fully understood reference now be made to the accompanying drawing in which:

FIG. 1 shows the layout of an EPR transmitter coil and an NMR receiver coil used in apparatus for carrying out the invention.

The apparatus that may be used for carrying out the invention may comprise conventional NMR imaging apparatus. An example of such apparatus is illustrated in J.Phys.E:Sci.Instrum.. vol 13 (1980) pp 947–955. The apparatus has a resistive side-access vertical-field magnet operating at 0.04T giving an NMR frequency of 1.7MHz. The apparatus is modified in that instead of a single RF transmit/receive coil being used, separate crossed transmit and receive coils are provided. The receive coil is illustrated in FIG. 1 and comprises a miniature split solenoid 1 of diameter 85 mm and length 67 mm. Alternatively, coil 1 can be used as a transmit/receive coil with a conventional duplexing arrangement.

An EPR resonator 2 is provided for generating a magnetic field along the axis of the NMR receive coil. EPR resonator 2 is cylindrical and has a diameter of 10 mm and a length of 20 mm. A sample to be examined is contained in a tube 3 positioned within EPR resonator 2. Alternatively, EPR resonator 2 can be aligned at 90° to the receive coil and coaxial with the transmit coil.

EPR resonator 2 is energised from a separate synthesised microwave frequency generator and the signal is amplified in a broadband amplifier. Resonator 2 itself consists of twenty loops connected in parallel and the parallel connected loops are connected in a parallel resonant circuit. Suitable trimming capacitors are included to allow resonator 2 to be attuned to the appropriate EPR frequency and matched to cable 4 supplying the EPR excitation. EPR resonator 2 can be replaced by a so-called birdcage resonator, which may be driven in quadrature, as described in J. Mag.Res.63 pp.222–228(1985). This enables the power applied to the sample by EPR irradiation to be reduced. The average power applied can be reduced by pulsing the EPR irradiation on and off during the NMR imaging pulse sequence, the EPR irradiation ending immediately before each NMR excitation pulse.

By lowering the static magnetic field strength the enhancement observed from a given sample will be increased for a constant size of EPR resonator and EPR irradiation power. A lower magnetic field strength therefore enables a lower concentration of free radicals to be imaged or a larger sample to be examined.

In operation of the apparatus described above a 2.5 mM aqueous solution of the nitroxide free radical TEMPOL (4-hydroxy-2,2,6,6-tetramethyl-piperidine-l-oxyl) at room temperature was provided in tube 3, which had an outside diameter of 10 mm and a length of 70 mm. EPR resonator 2 was irradiated continuously with microwave power of 1 W at a frequency of 1.12 GHz and a proton NMR image was obtained by operating the apparatus in accordance with the pulse sequence illustrated in Phys.Med.Biol., vol 25 (1980) pp. 751–756. This sequence is a saturation-recovery gradient-echo spin-warp pulse sequence. However, other conventional NMR imaging apparatus and other pulse sequences can be used if desired.

- Images were acquired on a 128×128 matrix, which was interpolated to 256×256 for display, with a field of view of 10 cm square. Repetition times varied between 200 ms and 1 s, giving image acquisition times of between 25.6 and 128 seconds.

The experiment was then repeated but with EPR resonator 2 unenergised. The difference between the enhanced and the unenhanced images was such that an image enhancement factor of −6.9 was observed. Much larger enhancements can be obtained using free radicals dissolved in organic solvents. Images have also been obtained with TEMPOL concentrations as low as 0.3 mM.

The potential of the method described above for oxygen concentration measurement was investigated by imaging simultaneously two identical solutions of 2.5 mM TEMPOL solution, one of which had been equilibrated with nitrogen by bubbling the gas through the sample and the other with air. The nitrogen-equilibrated sample exhibited a 40% greater enhancement than did the air equilibrated one. This effect occurs because EPR resonances of spin-labels are broadened in the presence of dissolved oxygen. A broad EPR line is more difficult to saturate so that the observed enhancement factor for a given microwave magnetic field strength is reduced.

We claim:

1. A method of obtaining image information representing the distribution of paramagnetic molecules in solution comprising the steps of:
   (1) applying radio-frequency radiation to excite EPR resonance in the solute and obtaining an NMR image signal of selected nuclei of the solvent, the signal from those selected nuclei which interact with electrons excited by the rf radiation being enhanced;
   (2) obtaining a separate NMR image signal of said selected nuclei which is unenhanced; and
   (3) deriving image information representing the difference between the enhanced and unenhanced image signals.

2. The method as claimed in claim 1 in which the said selected nuclei are protons.

3. The method as claimed in claim 1 which the said radio-frequency radiation is pulsed.

4. The method as claimed in claim 3 in which the NMR image signal is obtained by an NMR imaging pulse sequence.

5. The method as claimed in claim 4 in which the pulses of the said pulsed radio-frequency radiation end before each pulse of the said NMR imaging pulse sequence.

* * * * *